United States Patent [19]
Zhu et al.

[11] Patent Number: 5,768,183
[45] Date of Patent: Jun. 16, 1998

[54] MULTI-LAYER MAGNETIC MEMORY CELLS WITH IMPROVED SWITCHING CHARACTERISTICS

[75] Inventors: Xiaodong T. Zhu, Chandler; Saied N. Tehrani, Tempe; Mark Durlam, Chandler; Eugene Chen, Gilbert, all of Ariz.

[73] Assignee: Motorola, Inc., Schaumburg, Ill.

[21] Appl. No.: 723,159

[22] Filed: Sep. 25, 1996

[51] Int. Cl.$^6$ .................................................. G11C 11/15
[52] U.S. Cl. ................................... 365/171; 365/173
[58] Field of Search .................................. 365/158, 171, 365/173

[56] References Cited

U.S. PATENT DOCUMENTS

| | | |
|---|---|---|
| 3,962,690 | 6/1976 | Koenig et al. ............... 365/171 |
| 5,025,416 | 6/1991 | Prinz ............................ 365/171 |
| 5,083,112 | 1/1992 | Piotrowski et al. ........... 365/173 |
| 5,347,485 | 9/1994 | Taguchi et al. ............... 365/173 |
| 5,659,499 | 8/1997 | Chen et al. ................... 365/158 |

Primary Examiner—Son T. Dinh
Attorney, Agent, or Firm—Eugene A. Parsons

[57] ABSTRACT

A plurality of layers of magnetic material are stacked in parallel, overlying relationship and separated by layers of non-magnetic material so as to form a multi-layer magnetic memory cell. The width of the cell is less than a width of magnetic domain walls within the magnetic layers so that magnetic vectors in the magnetic layers point along a length of the magnetic layers, and the ratio of the length to the width of the magnetic memory cell is in a range of 1.5 to 10. The magnetic layers are antiferromagnetically coupled when the ratio is less than 4 and ferromagnetically coupled when the ratio is greater than 4.

13 Claims, 3 Drawing Sheets

FIG. 1
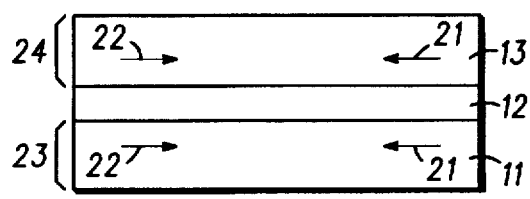
FIG. 3
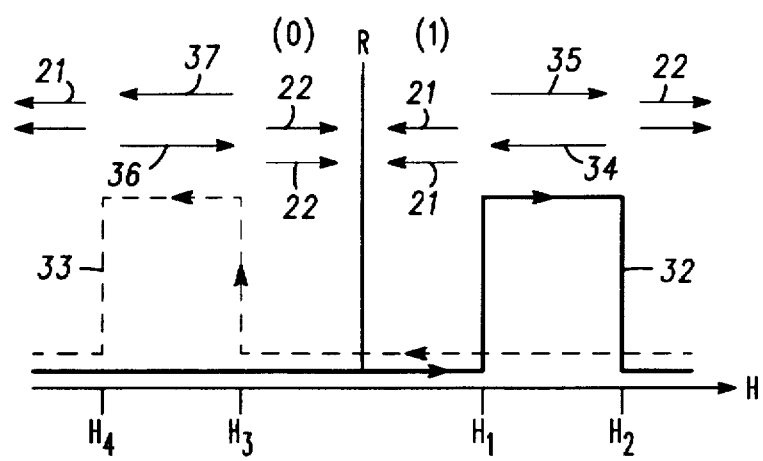
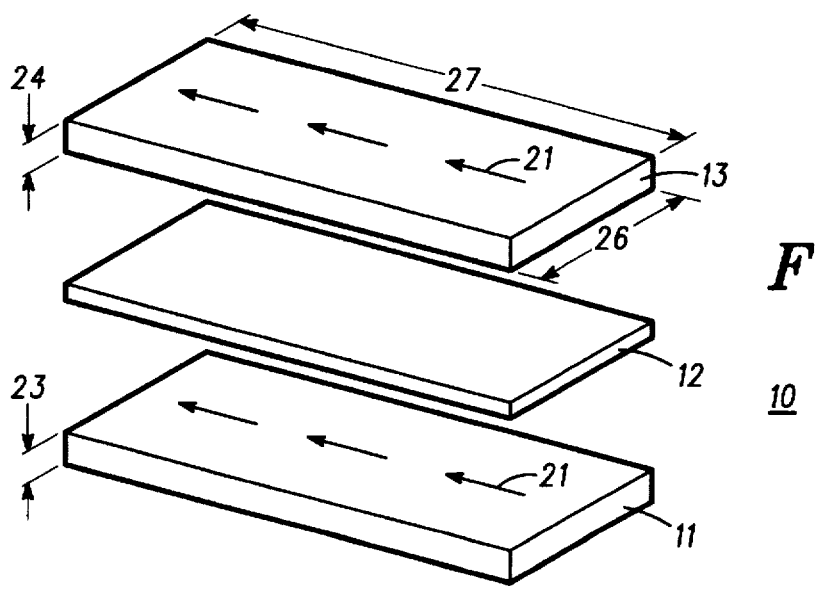
FIG. 2

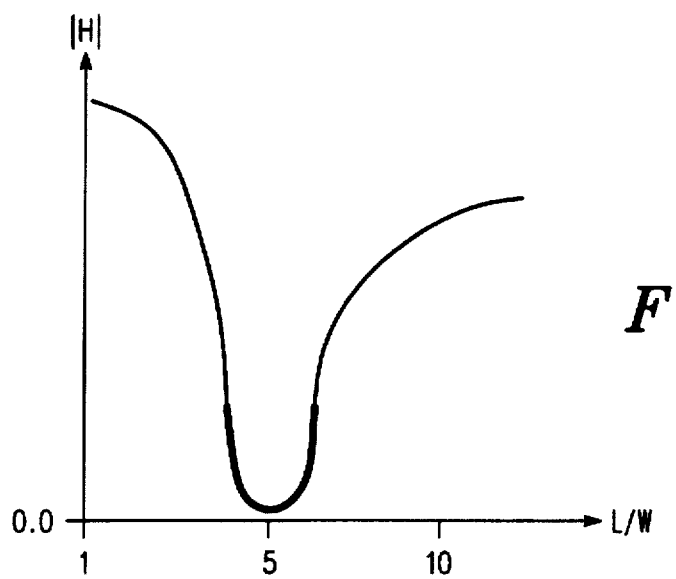
*FIG. 4*
*FIG. 5*
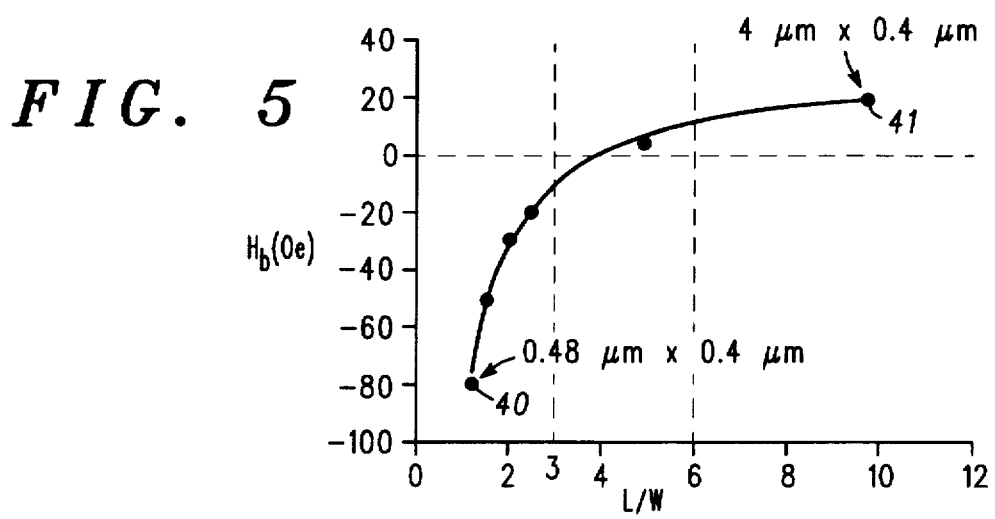
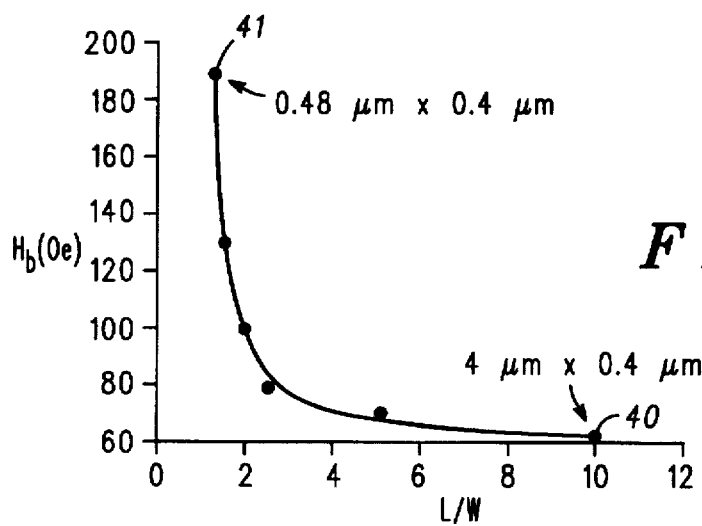
*FIG. 6*

MULTI-LAYER MAGNETIC MEMORY CELLS WITH IMPROVED SWITCHING CHARACTERISTICS

FIELD OF THE INVENTION

The present invention pertains to memory cells and more specifically to the switching characteristics of multi-layer magnetic memory cells.

BACKGROUND OF THE INVENTION

In the past, a variety of magnetic materials and structures have been utilized to form magnetoresistive materials for non-volatile memory elements, read/write heads for disk drives, and other magnetic type applications. One prior magnetoresistive element utilized a magnetoresistive material that has two magnetic layers separated by a conductor layer. The magnetization vectors of the two magnetic layers typically are anti-parallel to each other in the absence of any magnetic fields. The magnetization vectors of one of the layers points in one direction and the magnetization vector of the other layer always points in the opposite direction. The magnetic characteristics of such magnetic materials typically require a width greater than one micron in order to maintain the orientation of the magnetization vectors along the width of the cell. The large width requirement limits the density of memories utilizing such materials. Additionally, reading the state of such memories typically requires a two-phase read operation that results in very long read cycles. The two phase read operation also requires extra circuitry to determine the state of the memory, thus increasing the cost of such memories. An example of such a magnetic material and memory is disclosed in U.S. Pat. No. 4,780,848 issued to Daughton et al. on Oct. 25, 1988.

Another prior material uses multi-layer giant magnetoresistive materials (GMR) and utilizes dimensions around one micron, in order to increase density. A conductive layer is again disposed between the multi-layers of giant magnetoresistive material. In this structure the magnetization vectors are parallel to the length of the magnetic material instead of the width. In one embodiment the magnetization vector of one magnetic material layer is always maintained in one direction while the magnetization vector of the second magnetic layer switches between parallel and antiparallel to the first vector in order to represent both logical "0" to "1" states. This structure is commonly referred to as a spin valve structure. In order to determine the logical state of a memory cell utilizing this material, the memory cell has a reference cell and an active cell. The reference cell always provides a voltage corresponding to one state (either always a "1" or always a "0"). The output of the reference cell is compared to the output of the active cell in order to determine the state of the memory cell. The requirement for an active and a reference cell reduces the density of a memory that utilizes such elements. Additionally, each memory cell requires transistors to switch the active and reference cells at appropriate times in order to read the cells. This further increases the cost of the memory. More importantly, spin valve structures below 0.5 microns have been shown to lose a substantially detectable MR ratio, because of insufficient pinning at deep submicron dimensions.

A magnetic random access memory (MRAM) is a non-volatile memory which basically includes a giant magnetoresistive (GMR) material, a sense line, and a word line. The MRAM employs the GMR effect to store memory states. Magnetic vectors in one or all of the layers of GMR material are switched very quickly from one direction to an opposite direction when a magnetic field is applied to the GMR material over a certain threshold. According to the direction of the magnetic vectors in the GMR material, states are stored, for example, one direction can be defined as a logic "0", and another direction can be defined as a logic "1". The GMR material maintains these states even without a magnetic field being applied. The states stored in the GMR material can be read by passing a sense current through the cell in a sense line because of the a difference between the magnetic resistances of the two states.

A word line is typically a single metal line which is placed on top or bottom of the GMR material. In order to alternate the states in the various layers of GMR material, a word current of higher than 10 mA may be required in high density MRAM arrays. This current consumes much power and prevents MRAM arrays from becoming a strong candidate for portable applications.

Accordingly, it is highly desirable to provide magnetic random access memories and memory cells which are capable of being written (stored states switched) with less magnetic field.

It is a purpose of the present invention to provide a new and improved multi-state, multi-layer magnetic memory cell.

It is another purpose of the present invention to provide a new and improved multi-state, multi-layer magnetic memory cell with ferromagnetically coupled magnetic layers which switch states with a relatively low magnetic field.

It is still another purpose of the present invention to provide a new and improved multi-state, multi-layer magnetic memory cell with antiferromagnetically coupled magnetic layers and having novel operating modes.

It is a further purpose of the present invention to provide a new and improved multi-state, multi-layer magnetic memory cell which provides a wide operating range between switching states in different layers of material.

It is a still further purpose of the present invention to provide a new and improved multi-state, multi-layer magnetic memory cell which is simpler to manufacture and to use.

It is also a purpose of the present invention to provide a new and improved multi-state, multi-layer magnetic memory cell which, because of its size, results in a high density array of cells.

SUMMARY OF THE INVENTION

The above problems and others are at least partially solved and the above purposes and others are realized in a high density, multi-state, multi-layer magnetic memory cell including a plurality of layers of magnetic material stacked in parallel, overlying relationship and separated by layers of non-magnetic material so as to form a multi-layer magnetic memory cell having a length and a width. The width of the multi-layer magnetic memory cell is less than a width of magnetic domain walls within the layers of magnetic material wherein magnetic vectors in the layers of magnetic material point substantially along a length of the layers of magnetic material. The ratio of length to width of the multi-layer magnetic memory cell is either less than approximately 4 and the plurality of layers of magnetic material are antiferromagnetically coupled or greater than approximately 4 and the plurality of layers of magnetic material are ferromagnetically coupled.

When the length to width ratio is greater than 4, the ratio of length to width is further adjusted so that a first layer of the plurality of layers of magnetic material is switchable between the first and second magnetic states by a magnetic field with a relatively low strength, e.g. less than approximately 20 Oersteds, and a second layer of the plurality of layers of magnetic material is switchable between the first and second magnetic states by a magnetic field with a relatively high strength, e.g. greater than approximately 60 Oersteds.

BRIEF DESCRIPTION OF THE DRAWINGS

Referring to the drawings:

FIG. 1 is a simplified side view of a multi-layer magnetic memory cell including layers with different thicknesses, in accordance with the present invention;

FIG. 2 is an enlarged exploded view of the multi-layer magnetic memory cell of FIG. 1;

FIG. 3 is a graph generally illustrating switching characteristics of the cell of FIG. 1;

FIG. 4 is a graph illustrating absolute magnetic field versus the length/width ratio of a magnetic cell, such as the cell illustrated in FIG. 1;

FIGS. 5 and 6 are graphs illustrating the actual magnetic field required to switch the upper and lower layers, respectively, versus the length/width ratio of a magnetic cell, such as the cell illustrated in FIG. 1 with a fixed width;

DESCRIPTION OF THE PREFERRED EMBODIMENTS

Figure 7:
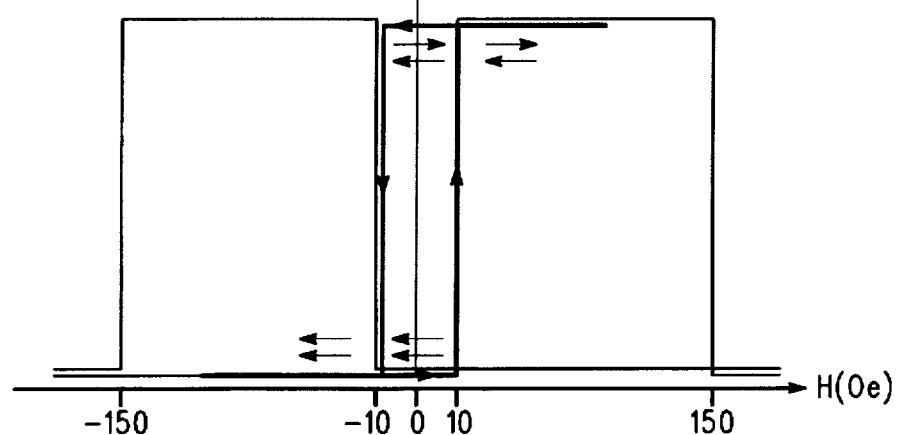
FIG. 7 is a graph illustrating switching characteristics of a cell, similar to the cell illustrated in FIG. 1, constructed in accordance with the present invention.

Turning now to the drawings, FIG. 1 illustrates an enlarged, simplified side view of a magnetic memory cell 10 having multiple layers that are ferromagnetically coupled. Cell 10 includes a first magnetic layer 11 and a second magnetic layer 13, which are separated by a first conducting or insulating spacer layer 12. Magnetic layers 11 and 13 each can be single layers of ferromagnetic materials such as a layer of nickel, iron, cobalt, or alloys thereof including alloys having palladium or platinum therein. Alternatively, either of layers 11 and 13 can be a composite ferromagnetic layer, such as a layer of nickel-iron-cobalt covering a layer of cobalt-iron or three layer structures including layers of cobalt-iron and nickel-iron-cobalt and cobalt-iron with cobalt-iron at the interface with adjacent layers. Materials that are suitable for layer 12 include most conductive materials such as Cu, Ag, Au, Cr and their alloys, or most non-conductive materials such as oxides, nitrides, dielectrics, etc. Additionally, layer 11 has a thickness 23 and layer 13 has a thickness 24 that is the same as or less than thickness 23. The reasons for the different thicknesses or different ferromagnetic materials are explained hereinafter.

Although shown having two magnetic layers in this embodiment, cell 10 can have more than two magnetic layers including a third magnetic layer 16, and a fourth magnetic layer 18, that typically are similar to layers 11 and 13 but may be formed of different materials or have different thicknesses, and are separated by a second conductive or non-conductive spacer layer 14 and a third conductive or non-conductive spacer layer 17 that are similar to layer 12. For sake of simplicity of the following explanation, layers 14, 16, 17, and 18 are omitted and consequently are shown in phantom simply to aid in understanding the different embodiment.

Turning now to FIG. 2, an enlarged exploded view of cell 10 is illustrated. Portions of FIG. 2 that have the same reference numbers as FIG. 1 are the same as the corresponding FIG. 1 elements. In the preferred embodiment, layers 11 and 13 are rectangular. Layers 11 and 13 each have magnetization vectors 21 that are positioned substantially along length 27, that is, substantially parallel to length 27. Additionally width 26 is formed to be smaller than the width of the magnetic domain walls or transition width within layers 11 and 13. Consequently, vectors 21 can not be parallel to width 26. Typically, widths of less than 1.0 to 1.2 microns result in such a constraint. In the preferred embodiment, width 26 is less than one micron and is as small as can be made by manufacturing technology, and length 27 is greater than width 26. Also in the preferred embodiment, thickness 24 is approximately three to six nanometers and thickness 23 is approximately four to ten nanometers. As will be seen hereinafter, the difference in thickness 23 and 24 affect the switching points of layers 11 and 13.

As illustrated in FIG. 1, vectors 21 and 22 in layers 11 and 13 represent two different states of magnetization within cell 10. It should be understood that these are the same vectors and that they are given different numbers only to indicate different states. One state is referred to as a logic "0" and the other state is a logic "1". While it will be understood by those skilled in the art that any logic definition can be assigned to either state, in this example when vectors 21 of layers 11 and 13 both point to the left in FIG. 1, cell 10 is in a logic "0" state and when vectors 22 in both layers 11 and 13 are in the opposite direction cell 10 is in a logic "1" state. Thus, for a first state magnetization vectors in both layers 11 and 13 point in a first direction and for a second state magnetization vectors in both layers 11 and 13 point in an opposite direction. Also, because layers 11 and 13 are ferromagnetically coupled the magnetic vectors of layers 11 and 13 are always pointing in the same direction (parallel) when no (or a very small) magnetic field is applied to cell 10. The magnetic vectors are only pointing in opposite directions (antiparallel) when specific magnetic fields are applied to cell 10, as will be explained in more detail presently.

In this specific example, cell 10 is designed so that the magnetization vectors in layer 13 can be switched much more easily than the magnetization vectors in layer 11. For example, one way to accomplish this design is to fabricate layer 13 much thinner than layer 11 so that a smaller magnetic field will switch the magnetization vectors of layer 13 than is required to switch the magnetization vectors of layer 11. Another way to accomplish this design is to form layer 11 out of magnetic material that requires a higher magnetic field to switch the magnetization vectors.

In one preferred embodiment, layer 12 is an insulating layer, the provision of which between ferromagnetic layers 11 and 13 produces a tunneling junction that allows a flow of current perpendicularly through layer 12, from layer 11 to layer 13 (or vice versa). Essentially, cell 10 appears as a relatively high impedance (referred to herein as a resistance R), generally several thousand ohms, e.g. 5 to 6 kohms. When the magnetization vectors in layers 11 and 13 are antiparallel the resistance R of cell 10 remains very high. When the magnetization vectors in layers 11 and 13 are antiparallel, the resistance R of cell 10 drops perceptibly.

In a specific example, layer 11 is formed of cobalt (Co) approximately 1000 Å thick, layer 12 is formed of aluminum oxide ($Al_2O_3$) approximately 100 Å thick, and layer 13 is formed of nickel iron (NiFe) approximately 1000 Å thick. The change of resistance versus the resistance (DR/R) is approximately 15% in the present specific example. Thus, the state of cell 10 is relatively easily sensed by passing a sense current therethrough from layer 11 to layer 13 (or vice versa). The change of resistance in cell 10 is easily read as a change in voltage drop across cell 10 which can conveniently be used in conjunction with memory arrays and the like. Utilizing the ratio DR/R=15%, it is clear that the change in voltage across cell 10 versus the voltage across cell 10 (DV/V) becomes 15%. Thus, in this example in which the resistance of cell 10 is 6 kohms, the change of voltage (DV) across cell 10 is approximately 90 mV for a 0.1 mA sensing current passing through cell 10.

While cell 10 of FIG. 1 is explained herein as a tunneling junction type of cell, it should be understood that the present invention applies equally to a conductive type of magnetic cell. In a conductive type magnetic cell, a conductive layer (e.g. layer 12 of FIG. 1) is disposed between the multi-layers of magnetic material. In this structure the magnetization vectors are again parallel to the length of the magnetic material. In one embodiment the magnetization vector of one magnetic material layer is always maintained in one direction while the magnetization vector of the second magnetic layer switches between parallel and antiparallel to the first vector in order to represent both logical "0" and "1" states.

Referring specifically to FIG. 3, a graph is illustrated showing the resistance of cell 10 versus different directions of orientation for the magnetic vectors in layers 11 and 13. Also, the direction and strength of an applied magnetic field, required to achieve the various vector directions is shown. The abscissa of the graph indicates magnetic field direction and strength and the ordinate represents the resistance of cell 10. Further, a first curve 32 indicates the cell resistance which can be achieved for the application of various strengths of a magnetic field in a first direction and curve 33 indicates the cell resistance which can be achieved for the application of various strengths of a magnetic field in a second direction. Vectors 34 and 35 are illustrated with curve 32 and represent the magnetic vectors in layers 11 and 13, respectively, for the application of a magnetic field between values $H_1$ and $H_2$ in the positive direction along the abscissa. Similarly, vectors 36 and 37 are illustrated with curve 33 and represent the magnetic vectors in layers 11 and 13, respectively, for the application of a magnetic field between values $H_3$ and $H_4$ in the negative direction along the abscissa.

Assuming cell 10 is in the state in which vectors 21 both point to the left, moving to the right along the abscissa, the magnetic field increases up to a value $H_1$. Before the value $H_1$ is reached, magnetic vectors 21 are oriented in the same direction, designated a logic "1", and the resistance of cell 10 is low. Upon applying sufficient magnetic field to cell 10, herein designated by the value $H_1$, vector 35 switches to an opposite direction (as shown) and the resistance of cell 10 increases perceptibly. As the magnetic field is increased beyond a value $H_2$ vector 34 also switches to an opposite direction and the resistance of cell 10 again drops to a low value with the magnetic vectors now being represented by vectors 22. Similarly, if the magnetic field is applied in the opposite direction curve 33 applies and magnetic vector 37 of layer 13 switches at a value $H_3$ and the magnetic vector 36 of layer 11 switches at a value $H_4$, with the magnetic vectors now being represented by vectors 21. It should be noted that once the vectors of layers 11 and 13 are set in the orientation depicted by vectors 21 or 22 they will remain in that orientation, even after the applied magnetic field is removed, until a magnetic field sufficiently strong to switch them is applied.

Further, the distance or field strength (operating range) between, $H_1$ and $H_2$, or $H_3$ and $H_4$, is determined by the materials used in cell 10 and the various dimensions of the layers. Generally, cell 10 is designed to provide a wide operating range. Thus, in this example and assuming that the magnetization vectors of layer 11 are set in the orientation indicated by curve 32 (vector 34) the cell can be set to a logic "0" (parallel magnetization vectors pointing right in FIG. 3) by applying a field with a strength greater than $H_2$, e.g. 50 Oersteds. Also, the cell can be set to a logic "1" (parallel magnetization vectors pointing left in FIG. 3) by applying a magnetic field greater than $H_4$, e.g. −50 Oersteds The following procedure can be used to read stored states in magnetic memory cell 10. Assuming that the vectors of layers 11 and 13 are set in the orientation indicated by curve 33 (vectors 22), applying a positive magnetic field to cell 10 (either $H_1$ or $H_2$) has no effect, which is an indication that the cell has a logic "0" stored therein. Conversely, applying a negative magnetic field to cell 10 between the values $H_4$ and $H_3$, will cause the magnetic vector in layer 13 to switch (vectors 36 and 37) to an antiparallel position and the substantial change in resistance of the cell can be detected as described above. In a similar fashion, when vectors of layers 11 and 13 are set in the orientation indicated by curve 32 (vectors 21), applying a negative magnetic field to cell 10 (either $H_3$ or $H_4$) has no effect indicating that the cell has a logic "1" stored therein. Conversely, applying a positive magnetic field to cell 10 between the values $H_1$ and $H_2$, will cause the magnetic vector in layer 13 to switch (vectors 34 and 35) to an antiparallel position and the substantial change in resistance of the cell is easily detected.

Turning now to FIG. 4, a graph illustrating absolute magnetic field required to switch the state of a magnetic cell versus the length/width ratio of the magnetic cell is illustrated. The graph of FIG. 4 applies primarily to a magnetic cell (e.g. cell 10 of FIG. 1), in which the magnetic vector in one layer is switched much more easily than the magnetic vector in a different layer for purposes of reading the state of the cell. As depicted in the graph of FIG. 4, utilizing cells with a width less than approximately 1 micrometer, a length/width ratio for a magnetic cell of approximately 5 results in the lowest absolute magnetic field required to switch the magnetization in the thinner (easier switching) layer. As will be seen presently, as the cell width approaches 0.1 micrometers the lowest absolute magnetic field is achieved as the length/width ratio approaches 4. While the present invention applies to substantially all multi-layer magnetic memory cells, the cell configuration and type illustrated in FIG. 1 is utilized herein for purposes of explanation. Further, it has been discovered that the distance or field strength (operating range) between, $H_1$ and $H_2$, or $H_3$ and $H_4$, is determined primarily by the length/width ratio of the magnetic cell.

Referring now to FIGS. 5 and 6, the graphs illustrated show actual magnetic fields required to switch states of upper magnetic layer 13 and lower magnetic layer 11, respectively, in magnetic memory cell 10 of FIG. 1 versus the length/width ratio of the magnetic cell. The graphs illustrated in FIGS. 5 and 6 are developed using magnetic cells, such as cell 10 of FIG. 1, with a fixed width which in this specific example is 0.4 micrometers. Also, the length of the magnetic cells utilized to develop the graphs of FIGS. 5 and 6 range between 0.48 micrometers at a point 40 to 4.0 micrometers at a point 41. The graph of FIG. 5 illustrates that a magnetic field with a strength of less than approximately 20 Oersteds is sufficient to switch the state of layer 13 in cell 10 of FIG. 1 if the length/width ratio of cell 10 is in a range of approximately 4.5 to 10. The graph of FIG. 6 illustrates that a magnetic field with a strength greater than approximately 60 Oersteds is required to switch the state of layer 11 in cell 10 of FIG. 1 if the length/width ratio of cell 10 is in a range of approximately 2 to 10. Thus, a magnetic memory cell having a length/width ratio in a preferred range of 4.5 to 10 requires a very low sensing or switching current and provides a very wide operating range.

An additional feature illustrated in FIG. 5, and which will be explained in more detail presently, is that in cells having a length/width ratio of greater than approximately 4 the first and second layers of magnetic material are ferromagnetically coupled while in cells having a length/width ratio of less than approximately 4 the first and second layers of magnetic material are antiferromagnetically coupled. Generally, for purposes of this disclosure the term "ferromagnetically coupled" means that either of the parallel states (magnetic vectors 21 or 22, in FIG. 1) is stable and does not require a constant magnetic field. Also, for purposes of this disclosure the term "antiferromagnetically coupled" means that either of the antiparallel states is stable and that the parallel state is unstable and does require a constant magnetic field, since the magnetic vectors always tend to move to an antiparallel state.

Referring specifically to FIG. 7, a graph is illustrated which shows the switching characteristics of a cell, similar to cell 10 illustrated in FIG. 1, constructed in accordance with the present invention. As described above, the cell can be a tunneling junction or a conduction type cell as long as at least one layer can be switched relatively easily with respect to the other layer. Also, in this specific example the width of the cell is 0.1 micrometers and the length is 0.5 micrometers. Thus, the length/width ratio is greater than approximately 4 and the cell operates in a ferromagnetically coupled mode.

Utilizing cell 10 of FIG. 1 for purposes of explanation, it can be seen from FIG. 7 that $H_1$, the magnetic field required to switch the magnetic vector in layer 13 from parallel to antiparallel, is 10 Oersteds. The magnetic field at $H_2$ required to switch the magnetic vector in layer 11 from antiparallel to parallel, is 150 Oersteds. Also, the magnetic field at $H_3$ required to switch the magnetic vector in layer 13 from antiparallel back to parallel is 10 Oersteds and the magnetic field at $H_4$ required to switch the magnetic vector in layer 11 from parallel to antiparallel, is 150 Oersteds. Thus, magnetic memory cell 10 constructed in accordance with the present invention requires a very low sensing current (because only current sufficient to produce more than 10 Oersteds is required to read the state of the cell) and provides a very wide operating range (i.e. 10–150 Oersteds).

Figure 8:
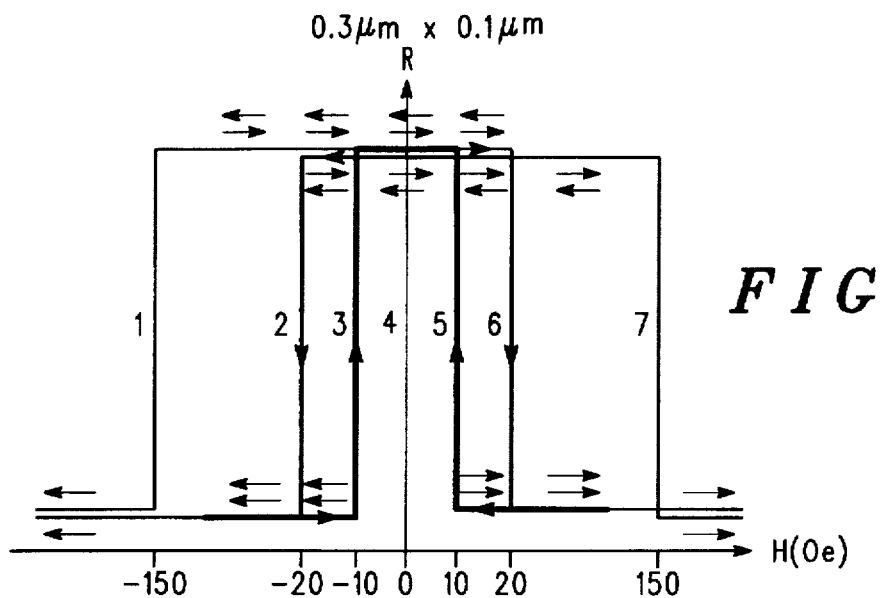
FIG. 8 is a graph illustrating switching characteristics of another embodiment of a cell, similar to the cell illustrated in FIG. 1, constructed in accordance with the present invention.

Referring specifically to FIG. 8, a graph is illustrated which shows the switching characteristics of a cell, similar to cell 10 illustrated in FIG. 1, constructed in accordance with a different embodiment of the present invention. Again as described above, the cell can be a tunneling junction or a conduction type cell as long as at least one layer is constructed to switch with a different magnetic field from another layer or layers. Also, in this specific example the width of the cell is 0.1 micrometers and the length is 0.3 micrometers. Thus, the length/width ratio is less than approximately 4 and the cell operates in an antiferromagnetically coupled mode. That is the magnetic layers will always return to a position in which the magnetic vectors are in an opposed orientation (pointing in opposite directions) when a writing magnetic field is removed, or not present.

Utilizing magnetic cell 10 of FIG. 1 again as an example for purposes of this explanation, and referring to FIG. 8 and the sets of vectors illustrated, the following modes are possible under the given conditions. Assume for this explanation that the vectors for layers 11 and 13 of cell 10 are both directed to the left in FIG. 8, as illustrated at the far left of FIG. 8. If a negative 10 Oersteds is applied to cell 10, layer 13 will switch and its vector will point to the right in FIG. 8 while the vector of layer 11 continues to point to the left. Thus, the resistance of cell 10 will rise to the maximum level. In order to switch the vector of layer 13 back so that it again points to the left a minus 20 Oersteds can be applied. With the vector of layer 11 pointing left and the vector of layer 13 pointing right, the resistance of cell 10 will remain high and the vectors will remain in this position or mode even when the magnetic field is removed.

To change to an opposite mode, a magnetic field of 150 Oersteds is applied and layer 11 switches so that its vector points to the right. Thus, both vectors point to the right (as illustrated at the far right of FIG. 8) and the resistance of cell 10 drops to a minimum. Again moving back toward zero magnetic field, when a magnetic field of 10 Oersteds is applied to cell 10, layer 13 will switch and its vector will point to the left in FIG. 8 while the vector of layer 11 remains pointing toward the right. At this point the resistance of cell 10 will again rise to a maximum and the second stable mode is achieved. If the magnetic field is removed at this point (anywhere between 10 and −150 Oersteds) cell 10 will remain in the second mode. Applying a magnetic field of −150 Oersteds switches layer 11 and, thus, switches cell 10 back to the original mode (far left vectors in FIG. 8).

The two vector opposed orientations illustrated in FIG. 8 at the zero Oersteds line are the two stable states of this type of cell. To read the cell one has simply to apply a field either larger than a plus 20 Oersteds or smaller than a minus 20 Oersteds magnetic field to cell 10 and sense whether or not the resistance of the cell changes. Depending upon which stable mode is stored in cell 10 during the reading process, the resistance will either drop or not drop and the stored mode will be apparent. For example, if a field smaller than −20 Oersteds magnetic field is applied and the resistance of the cell drops, it is clear that the first mode was stored in the cell. Alternatively, if a field larger than 20 Oersteds magnetic field is applied and the resistance of the cell drops, it is clear that the second mode was stored in the cell. If no change occurs with either of the magnetic field applications, it is a clear sign that the opposite modes were stored.

Figure 9:
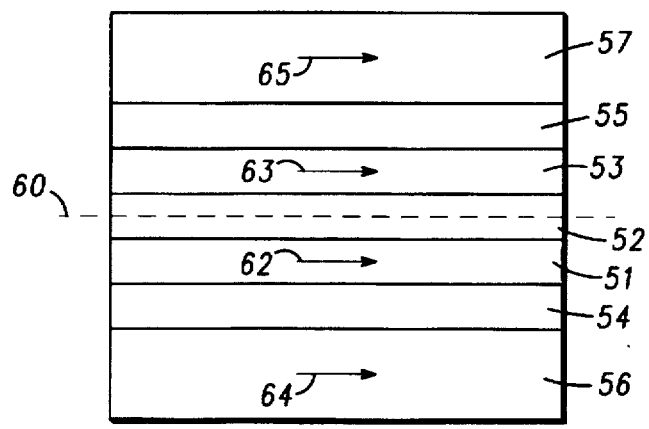
FIG. 9 is a simplified side view of a symmetrically constructed, multi-layer magnetic memory cell including layers with different thicknesses, in accordance with the present invention.

Turning now to FIG. 9, an embodiment of a symmetrical multi-layer magnetic memory cell 50 is illustrated. Cell 50 includes a pair of layers 51 and 53 formed of magnetic material and separated by a layer 52 of non-magnetic material, which may be electrically conducting material or insulating material, depending upon the type of memory cell being utilized. A pair of non-magnetic layers 54 and 55 are positioned to sandwich magnetic layers 51 and 53 therebetween and a second pair of magnetic layers 56 and 57 are positioned with layers 54 and 55 sandwiched therebetween so as to form a stack of alternating magnetic and non-magnetic layers. Layers 51 through 57 are positioned so as to define a central plane 60 through the stack substantially parallel with the various layers. Further, layers 51, 54 and 56 are substantially similar to layers 53, 55 and 57 so that the layers are formed and positioned symmetrically on either side of central plane 60.

Magnetization vectors 62, 63, 64, and 65 for layers 51, 52, 56, and 57 are illustrated. Layers 56 and 57 are thicker than layers 51 and 53 (and/or are formed of different material) and require a higher magnetic field to switch states. Thus, when the length/width ratio is greater than approximately 4 cell 50 operates in a ferromagnetically coupled mode and vectors 62 and 63 of layers 51 and 52 both switch at, for example, $H_1$ or $H_3$ (see FIG. 7), while both vectors 64 and 65 of both layers 56 and 57 switch at $H_2$ or $H_4$. When the length/width ratio is less than approximately 4, cell 50 operates in an antiferromagnetically coupled mode and the vectors switch in accordance with a graph similar to that of FIG. 8. Magnetic memory cell 50 is illustrated and disclosed herein as another embodiment of a magnetic memory cell which can be used as any of the above described types in place of cell 10 of FIG. 1.

Thus, several embodiments of magnetic memory cells are illustrated and disclosed which substantially reduce the amount of sense current required to read stored information in a cell. The presently disclosed multi-state, multi-layer magnetic memory cells are substantially smaller, simpler, and easier to manufacture and use. Also, multi-state, multi-layer magnetic memory cells can be fabricated as described above using well known and well developed semiconductor techniques. Further, several different embodiments and types of magnetic cells are disclosed which can be easily tailored for different applications and functions.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A multi-state, multi-layer magnetic memory cell comprising:
   a plurality of layers of magnetic material stacked in parallel, overlying relationship and separated by layers of non-magnetic material so as to form a multi-layer magnetic memory cell having a length and a width;
   the width of the multi-layer magnetic memory cell being less than a width of magnetic domain walls within the layers of magnetic material wherein magnetic vectors in the layers of magnetic material point substantially along a length of the layers of magnetic material; and
   a ratio of the length of the multi-layer magnetic memory cell to the width of the multi-layer magnetic memory cell being in a range of 1.5 to 10.

2. A multi-state, multi-layer magnetic memory cell as claimed in claim 1 wherein the plurality of layers of magnetic material stacked in parallel, overlying relationship and separated by layers of non-magnetic material define a central plane parallel with the stacked layers, the plurality of layers of magnetic material being formed and positioned on either side of the central plane so as to form a symmetrical stack about the central plane.

3. A multi-state, multi-layer magnetic memory cell as claimed in claim 2 wherein the plurality of layers of magnetic material includes two substantially similar first layers positioned on opposite sides of the central plane and each having a first thickness, the two substantially similar first layers being separated by a layer of non-magnetic material, and two substantially similar second layers positioned on opposite sides of the first layers and separated from the first layers by layers of non-magnetic material, each of the two substantially similar second layers having a second thickness greater than the first thickness.

4. A multi-state, multi-layer magnetic memory cell as claimed in claim 2 wherein the layers of non-magnetic material are formed with non-magnetic, electrically insulative material.

5. A multi-state, multi-layer magnetic memory cell as claimed in claim 1 wherein the layers of non-magnetic material are formed with non-magnetic, electrically conductive material.

6. A multi-state, multi-layer magnetic memory cell as claimed in claim 1 wherein the ratio of the length of the multi-layer magnetic memory cell to the width of the multi-layer magnetic memory cell is approximately 5 and the first and second layers of magnetic material are ferromagnetically coupled.

7. A multi-state, multi-layer magnetic memory cell as claimed in claim 1 wherein the ratio of the length of the multi-layer magnetic memory cell to the width of the multi-layer magnetic memory cell is less than approximately 4 and the first and second layers of magnetic material are antiferromagnetically coupled.

8. A multi-state, multi-layer magnetic memory cell comprising:
   a first layer of magnetic material having a first thickness;
   a layer of non-magnetic material positioned adjacent the first layer of magnetic material;
   a second layer of magnetic material positioned adjacent the layer of non-magnetic material and having a second thickness greater than the first thickness, the first layer of magnetic material and the second layer of magnetic material being separated by the layer of non-magnetic material and stacked in parallel overlying relationship to form a multi-layer magnetic memory cell having a length and a width;
   the first and second layers of magnetic material each having a width that is less than a width of magnetic domain walls within the layer of magnetic material wherein magnetic vectors in the layers of magnetic material point substantially along a length of the layers of magnetic material; and
   a ratio of the length of the multi-layer magnetic memory cell to the width of the multi-layer magnetic memory cell being in a range of 1.5 to 10.

9. A multi-state, multi-layer magnetic memory cell as claimed in claim 8 wherein the width of the multi-layer magnetic memory cell is less than 1 micrometer.

10. A multi-state, multi-layer magnetic memory cell as claimed in claim 9 wherein the width of the multi-layer magnetic memory cell is approximately 0.1 micrometers.

11. A multi-state, multi-layer magnetic memory cell as claimed in claim 8 wherein the ratio of the length of the multi-layer magnetic memory cell to the width of the multi-layer magnetic memory cell is approximately 5 and the first and second layers of magnetic material are ferromagnetically coupled.

12. A multi-state, multi-layer magnetic memory cell as claimed in claim 8 wherein the ratio of the length of the multi-layer magnetic memory cell to the width of the multi-layer magnetic memory cell is less than approximately 4 and the first and second layers of magnetic material are antiferromagnetically coupled.

13. A multi-state, multi-layer magnetic memory cell as claimed in claim 8 wherein the first layer of magnetic material has a first magnetic state and a second magnetic state and is switchable between the first and second magnetic states by a magnetic field with a strength of less than approximately 20 Oersteds and the second layer of magnetic material has a first magnetic state and a second magnetic state and is switchable between the first and second magnetic states by a magnetic field with a strength of greater than approximately 60 Oersteds.

* * * * *